United States Patent
Cardwell

(10) Patent No.: US 11,519,762 B2
(45) Date of Patent: Dec. 6, 2022

(54) ELECTRONIC SENSORS SUPPORTED ON A FLUID CONDUIT

(71) Applicant: COOPER-STANDARD AUTOMOTIVE, INC., Northville, MI (US)

(72) Inventor: Brian J. Cardwell, Ypsilanti, MI (US)

(73) Assignee: Cooper-Standard Automotive, Inc., Northville, MI (US)

( * ) Notice: Subject to any disclaimer, the term of this patent is extended or adjusted under 35 U.S.C. 154(b) by 0 days.

(21) Appl. No.: 17/667,808

(22) Filed: Feb. 9, 2022

(65) Prior Publication Data
US 2022/0236085 A1    Jul. 28, 2022

Related U.S. Application Data

(63) Continuation of application No. 16/953,703, filed on Nov. 20, 2020, now Pat. No. 11,287,291.

(51) Int. Cl.
| | | |
|---|---|---|
| G01K 7/22 | (2006.01) | |
| G01D 11/24 | (2006.01) | |
| G01K 1/143 | (2021.01) | |
| H05K 3/28 | (2006.01) | |
| G01M 3/04 | (2006.01) | |
| H05K 3/12 | (2006.01) | |
| G01L 19/14 | (2006.01) | |

(52) U.S. Cl.
CPC ........... G01D 11/245 (2013.01); G01K 1/143 (2013.01); G01L 19/147 (2013.01); G01M 3/04 (2013.01); H05K 3/12 (2013.01); H05K 3/28 (2013.01)

(58) Field of Classification Search
CPC .................................. G08C 17/02; G01K 7/22
See application file for complete search history.

(56) References Cited

U.S. PATENT DOCUMENTS

| | | | | |
|---|---|---|---|---|
| 9,068,445 | B2 * | 6/2015 | Read | E21B 47/017 |
| 9,287,936 | B2 * | 3/2016 | Ali | H02J 50/20 |
| 2017/0089496 | A1 * | 3/2017 | Lennon | F16L 13/146 |
| 2018/0125599 | A1 * | 5/2018 | Merza | G01L 9/08 |

FOREIGN PATENT DOCUMENTS

GB          2403016 A  * 12/2004  ............... G01F 1/58

* cited by examiner

*Primary Examiner* — Jamel E Williams
(74) *Attorney, Agent, or Firm* — Paschall & Associates, LLC; James C. Paschall

(57) ABSTRACT

This disclosure relates to a fluid conduit that incorporates electronic sensors printed on a flexible substrate that is attached to an exterior wall of the fluid conduit. The sensors are configured to sense an operating parameter of the fluid conduit and to provide output signals representing the sensed operating parameter. An electrical conductor is deposited on the exterior wall of the fluid conduit for communicating the output signals.

20 Claims, 3 Drawing Sheets

ELECTRONIC SENSORS SUPPORTED ON A FLUID CONDUIT

CROSS-REFERENCE TO RELATED APPLICATIONS

This application is a continuation application of U.S. patent application Ser. No. 16/953,703, filed Nov. 20, 2020, which is incorporated herein in its entirety.

TECHNICAL FIELD

This disclosure is generally directed to a fluid conduit. More specifically, this disclosure relates to electronic sensors printed on a flexible substrate and attached to a fluid conduit for monitoring the operating parameters of a medium flowing in the conduit.

BACKGROUND

Fluid conduits are used in applications when connections are required for the transfer of liquids or gaseous media. The selection of a fluid conduit generally depends on the specific requirements of the intended use, with the result that a plurality of properties of the conduit such as e.g., temperature, pressure load and conduit integrity are required to be taken into account.

In many cases fluid conduits used in vehicles to transfer fluids do not include probes or other sensors physically attached to a conduit for measuring and monitoring safety-related operating parameters, such as, monitoring the temperature and volume flow of a medium flowing in the fluid conduit.

In principle it would be desirable to monitor the operating parameters of mediums flowing in the fluid conduits of a vehicle, such as, fuel delivery, cooling fluids used to cool an engine, hydraulic fluid used in steering and brake systems and pneumatic air systems. By directly monitoring the operating parameters of the conduits, disruptions such as pressure drops, temperature variations of the fluid conveyed by the conduit, as well as excessive stress on the conduit material can be recognized and remedied. By monitoring the operational parameters of a conduit potential causes of a disruption can be quickly diagnosed and identified. In this way, the lifetime and reliability of the vehicle and its fluid conduits can be increased, and failures can be minimized.

Therefore, it is an object of the present invention to provide a fluid conduit which allows the monitoring of operating and functional parameters of the conduit in a simple manner. By way of example, the parameters to be monitored may include, but are not limited to, the temperature of the conduit wall and/or of the medium flowing in the conduit, the positive or negative pressure acting on the conduit wall, and the detection of the fluid leakage from the conduit wall leading to the integrity of the conduit and the degree of ageing of the material of the conduit.

SUMMARY

This disclosure relates to electronic sensors printed on a flexible substrate and attached to a fluid conduit for monitoring the operating parameters of mediums flowing in the conduit.

In a first embodiment, a fluid conduit includes an interior diameter and an exterior wall. A flexible substrate has electronic material printed on the substrate, the electronic material configured to sense at least one operating parameter of the fluid conduit and to provide output signals representing the sensed operating parameter. An adhesive layer is used to attach the substrate to the exterior wall of the fluid conduit and an electrical conductor is deposited on the exterior wall of the fluid conduit for communicating the output signals.

In a second embodiment a method is provided. The method includes sensing at least one operating parameter of a fluid conduit that includes an exterior wall. The method includes printing electronic material on a flexible substrate, the electronic material used to sense the at least one operating parameter and to provide output signals representing the sensed operating parameter. The method further including applying an adhesive layer to attach the substrate to the exterior wall of the fluid conduit and depositing an electrical conductor to the exterior wall of the fluid conduit for communicating the output signals.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
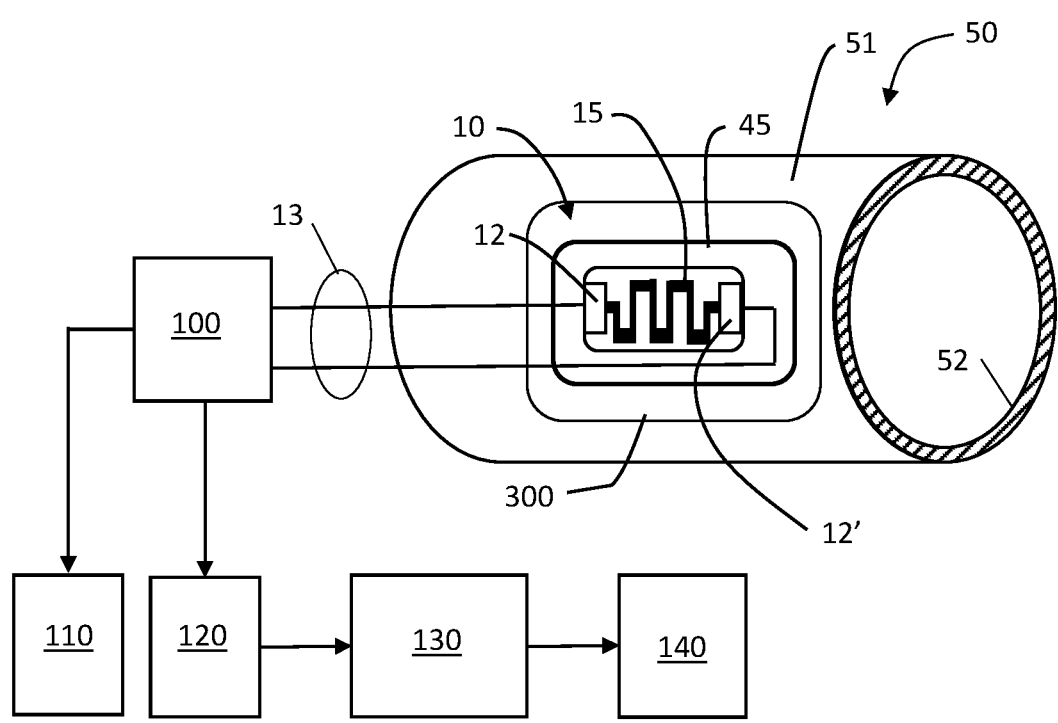
FIG. 1 illustrates an example fluid conduit having a temperature sensor printed on a flexible substrate and attached to the fluid conduit in accordance with the present disclosure.

The figures, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Within the meaning of this application, by the term "fluid conduit" is meant a conduit, as well as conduit couplings and parts thereof. The conduit usually takes the form of an elongated, cylindrical hollow body. At one or both of its ends, the conduit optionally has a conduit coupling or a part of a conduit coupling, a so-called fitting, by means of which the conduit can be connected to e.g., another conduit or other conduit units, such as a fixed pipe system or other parts of a pipe assembly.

In a preferred embodiment of the present disclosure, the conduit and the wall of the conduit are comprised of thermoplastic material, such as by example and non-imitatively, polyamides (PA) or Polyolefins such as polyethylene (PE) or polypropylene or their co-polymers or polyvinylchloride (PVC). The conduit and the walls of the conduit may also be comprised of flexible compounds including both thermoplastic elastomers and thermoset rubbers. For example, thermoplastic elastomers such as dynamically vulcanized ethylene propylene diene-monomer (EPDM) such as Santoprene, Sarlink or other thermoplastics elastomers based on urethane (TPU), such as by example Laripur or Desmopan. Thermoset rubber compounds can be based on polydimethyl siloxane (PDMS) as well as materials based on EPDM rubber, chloroprene, Acrylate (ACM or AEM), Acrylonitrile-Butadiene (Nitrile) rubber or the like.

Such thermoplastic conduits can for example be produced in such a way that the thermoplastic material or material layers are extruded directly into the form of the desired conduit. Alternately, the thermoplastic material can, e.g., by means of extrusion, be transformed into the form of a material web, such as e.g., an extruded profiled rim or a film web, which is then wound helically and in which longitudinal edge sections of adjacent spiral windings, or the opposite edge areas of the material web, are connected to each other overlapping. Furthermore, it is also possible that the conduit wall comprises several plies or layers of the thermoplastic material which are arranged one on top of another e.g., in the form of several film plies ("sandwich construction").

A sensor assembly as disclosed herein comprises a flexible sensor subassembly attached to the conduit wall. The sensor subassembly includes a flexible substrate on which electronic materials are deposited. In examples described herein, the sensor subassembly comprises a circuit subassembly in which the flexible substrate comprises a flexible dielectric substrate, which may be a polymer-based substrate, such as KAPTON or UPILEX, and the electronic materials comprise a plurality of conductive and resistive material, such as copper, tin, silver, nickel, aluminum, carbon or gold are formed, etched, deposited, plated, printed, or otherwise applied to or embedded in the flexible substrate. In a second example the electronic materials described above can be also applied to or embedded in thermoset rubber compounds based on polydimethyl siloxane (PDMS) as well as materials based on EPDM rubber. Generally, the cross-linked cured version of PDMS resembles rubber in a solidified form. PDMS is widely known to be easily stretched and bent in all directions, providing a suitable dielectric substrate for flexible sensor assemblies that will be used with hoses composed of thermoset rubber compounds.

The printed electronic materials have at least one material property which is variable depending on at least one operating parameter of the conduit. By "operating parameter" within the meaning of this application is meant a state variable of the conduit, which is selected in particular from the group consisting of the temperature of the conduit wall, e.g. the temperature in the inside of the conduit wall or the temperature on the inner surface of the conduit wall, with the result that the temperature of the medium located in the conduit can be inferred; the positive or negative pressure acting on the conduit wall and the integrity of the conduit wall due to leakage of fluid from the conduit wall due to a break in the conduit wall or ageing of the material of the conduit wall. The printed electronic material is formed such that it is suitable for determining at least one operating parameter.

The conduit according to the invention thus has the great advantage that, because of the electronic sensor applied to the conduit wall, one or more desired operating parameters of the conduit can be determined in a simple manner directly and without the use of external measuring probes.

The printed electronic material is preferably in the form of at least one sensor. The invention is based on printing on the exterior of the flexible substrate an electronic sensor from the electronic material. A single printed electronic sensor or several printed electronic sensors can be used. For example, it is possible to use a plurality of printed electronic sensors in order to realize the same operating parameter several times or at several points of the conduit and or different functions individually or combined with one another.

It should be noted here that the exterior wall of the conduit is in a close relationship to the inside interior wall of the conduit, and therefore with, for example, the fluid located in the interior of the conduit. As a result, the operating parameters of the electronic material can be exercised close to the interior of conduit and the fluid contained therein. This can make the effect that a sensor comprised of printed electronic material, for example, can provide better measurement results due to the sensor being as close as possible to the interior of the conduit.

The flexible substrate is chosen from a material that will allow the substrate to conform to and lay flat against the conduit wall. The substrate material may be a polyimide or other suitable flexible material having a thickness of about 12-50 µm with a relatively high modulus of elasticity (i.e., Young's modulus) in the plane of the substrate, such as UPILEX or similar material having a modulus of elasticity in the range of about 8-9 GPa or KAPTON, having a typical modulus of elasticity of 2-3 GPa, Alternately, that substrate material may be a highly flexible thermoset rubber compound such as PDMS, having a typical modulus of elasticity between 360 to 870 KPa for a substrate thickness of 20 µm.

The production of the printed electronic material on the flexible substrate can take place via a printing process or via the combination of different printing processes. For example, the printed electronic material may be deposited on the flexible substrate by means of etching, depositing, or printing, e.g., by known lithographic techniques, such as by a screen-printing process and or by means of a digital printing deposition process. Thus, various printing methods can be used to utilize the respective properties to print the various printed electronics on or embedded in the flexible substrate. The printing methods just described can be used, in the direct printing of printing electronic materials in the form of inks for a desired sensor structure. Alternately, in a preparatory step, an adhesion promotion layer can be applied first to the surface of the flexible substrate before printing the desired sensor structures thereon. Additionally, in still another preparatory step, the desired sensor structures may be made by laser etching or engraving the flexible substrate surface and then filling with the electronic material that forms the sensor structure and interconnecting conductor wiring.

The flexible substrate is attached to the rigid surface of a conduit using an adhesive layer applied to either the surface of the conduit or to the flexible substrate or alternately to both. The adhesive would be applied to the flexible substrate opposite the surface where the sensor structure is printed. Suitable adhesives include acrylic-based thermoset adhesives, such as DuPont PYRALUX LF or PYRALUX FR sheet adhesive or bond ply adhesive. Other adhesives for attaching the flexible substrate and sensor to the conduit may comprise flexible rubber adhesive with particle fillers, nano-fillers, or other fillers to further increase the modulus of elasticity of the adhesive. Again, in various embodiments, such adhesive fillers can also be used to tailor other properties of the adhesives, such as rigid filler materials with dielectric constants to reduce negative impact of the adhesive thickness on temperature, elasticity, or conductivity.

According to one aspect of the present invention, the conduit includes a protective layer of insulated material deposited on the outside wall of the conduit applied over the flexible substrate and selected portions of electronic material. In this way, the printed electronics are covered and protected from damage from external influences caused by road debris and any environmental or mechanical effects in the operation of a vehicle.

In accordance with the present invention, the printed electronic materials are designed as sensors to detect an operating parameter of the conduit, such as for example, a temperature sensor, a pressure sensor, or a leak detection sensor. As a result, at least one operating parameter of the conduit can be sensed which is exerted on the exterior wall of the conduit from the interior. Turning to FIG. 1, an example temperature sensor 10 is shown which is arranged as a negative temperature coefficient (NTC) thermistor. Thermistor material 15 is printed on the surface of a flexible substrate 45 between conductive pads 12 and 12'. The conductive pads 12 and 12' are electrically connected to conductor wires 13. The substrate 45 is then attached to conduit wall 51 using a suitable adhesive as was explained earlier.

The flexible substrate 45 is chosen from a material that will allow the substrate to conform to and lay flat against the conduit wall 51 when attached to conduit 50 such as substrate material that has a modulus of elasticity of at least a value in the range of about 2-9 GPa for polyamide substrates or 360 to 870 KPa for thermoset rubbers.

For an NTC thermistor, when the temperature increases, the resistance sensed by the thermistor decreases. Conversely, when temperature decreases, the resistance of the thermistor material increases. The resistance sensed by the thermistor 15 is sensed by a wire network comprised of electrical conductors 13 that extend in the axial direction of the conduit parallel to the conduit axis or can also extend helically about the conduit axis. Alternately, the conductors 13 can be embedded in the exterior wall 51.

The conductors 13 are run to a terminal block or a junction box, such as for example, terminal block 100 where a device 110 can be connected that is adapted to read the resistance of thermistor 15 and convert the resistance to a temperature reading for display on a gauge or an alpha-numeric display. Additionally, the output signals can also be applied to a recording device or memory 120. The recording device can store the sensor 10 readings over time providing a historical record of the data read by sensor 10. The recording device can also be communicatively connected to a data processing device 130 that can process the output signals for display using a computer display device 140.

Figure 2:
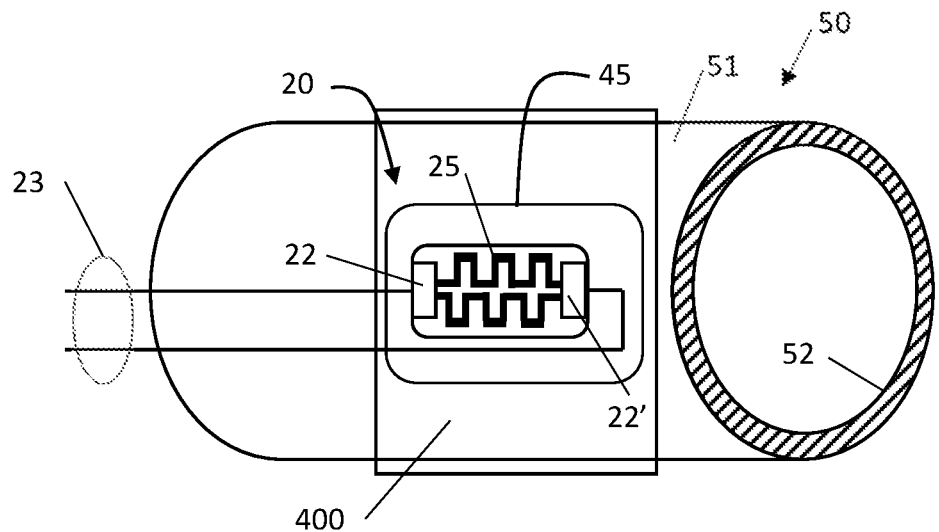
FIG. 2 illustrates an example fluid conduit having a strain gauge sensor printed on a flexible substrate and attached to the fluid conduit in accordance with the present disclosure.

Turning now to FIG. 2, an example printed electronics strain gauge sensor 20 is illustrated. The printed electronic material for a strain gauge 20 is printed on a flexible substrate 45. The flexible substrate 45 is chosen from a material that will allow the substrate to conform and lay flat against the conduit wall 51 when attached to conduit 50. Strain gauges are known in the state of the art and constitute devices for recording elongation and compression deformations. Deformations of the strain gauge, changes the electrical resistance of the strain gauge, with the result that it is possible to use the electrical resistance of the strain gauge to infer deformations of the conduit 50 due to the pressure applied by the fluid to the inside wall 52, or due to a mechanical elongation or compression of conduit 50. As was explained above for the temperature sensor 10, the strain gauge electronic material 25 is printed on the flexible substrate 45. Strain gauge restive elements 25 are printed between conductive pads 22 and 22' and the flexible substrate 45 is attached using a suitable adhesive to the exterior wall 51 of conduit 50. Conductive pads 22 and 22' electrically connect to the strain gauge resistive elements 25 and are in turn electrically connected to a wire network comprised of electrical conductors 23. The conductors 23 extend in the axial direction of the conduit 50 parallel to the conduit axis or helically or about the conduit axis. Alternately, the conductors 23 can be embedded in the conduit wall 51.

As was explained above for the temperature sensor 10, the conductors 23 can be run to a terminal block 100. Wherein the output signal from the strain gauge 20, can be read by a device 110 that is able to read the resistance of the strain gauge 20 and convert the resistance to a pressure reading for display on a gauge or alpha-numeric display. Additionally, the output signals can also be applied to a recording device 120 where the output signals can be recorded.

Figure 3:
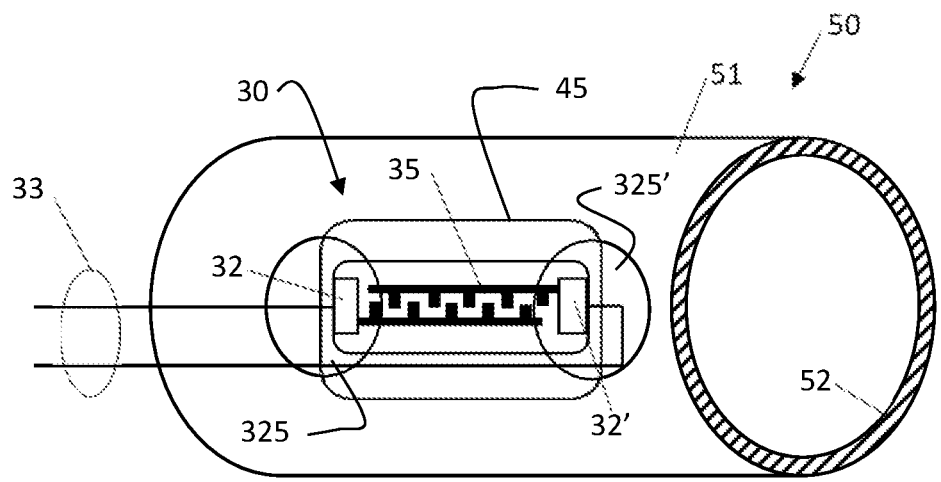
FIG. 3 illustrates an example fluid conduit having a leak detection sensor printed on a flexible substrate and attached to the fluid conduit in accordance with the present disclosure.

FIG. 3 illustrates an example leak detection sensor 30 in accordance with the disclosure. The electronic material for a leak detector is printed to a flexible substrate 45. The electronic material for a leak detector 30 comprises a series of conductive traces or legs 35 that are printed on the flexible substrate 45 between conductive pads 32 and 32' and the flexible substrate 45 is attached using a suitable adhesive to the exterior wall 51 of conduit 50. The flexible substrate 45 may have the conductive traces 35 printed for a specific size of coverage. For example, the conductive traces 35 can be printed on a substrate 45 having a specific size in order to cover a specific area of the conduit, or for covering multiple areas of the conduit using multiple substrates. Additionally, or alternately, a single long flexible substrate 45 having homogeneous continues traces 35 or a plurality traces 35 segments printed thereon could be attached to exterior wall 51 to cover the entire length of a conduit 50.

In principle, measurement of a fluid leak by the leak detector 35 is based on the conductivity read at the conductive traces 35. Traces 35 on the leak detector 30 are electrical contacts, and when something conductive, such as fluid touches them, it registers as a change in conductivity, such as for example, a short circuit. The conductive traces are electrically connected to a wire network comprising electrical conductors 33. The conductors 33 can extend in the axial direction of the conduit parallel to the conduit axis or helically about the conduit axis. Alternately, the conductors 33 can be embedded in the exterior wall 51. The conductors 33 are run to a terminal block 100, that has a device 110 that reads the conductivity of the leak detection sensor 30, providing a reading to a gauge or other alpha-numeric display, warning a technician of potential leaks on the conduit wall 51 and signifying a fault in the integrity of the conduit 50. Additionally, the output signals can also be applied to a recording device 120 where the output signals can be recorded over time providing a historical record of detected fluid leaks.

Figure 4:
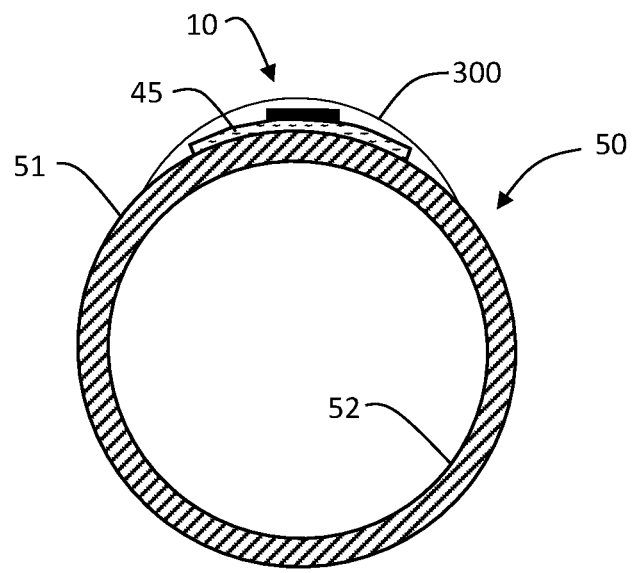
FIG. 4 is a sectional view illustrating an example fluid conduit having a printed sensor printed on a flexible substrate and attached to the fluid conduit including a protective layer in accordance with the present disclosure.
Figure 5:
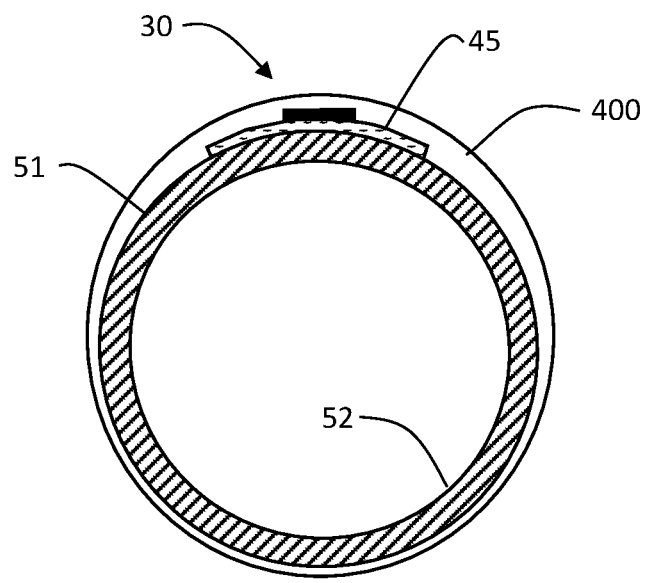
FIG. 5 is a sectional view illustrating an example fluid conduit having a printed sensor printed on a flexible substrate and attached to the fluid conduit including a protective layer in accordance with the present disclosure.

As was explained earlier and which can be best seen at FIG. 1 and FIG. 4, the conduit can include a protective layer 300 deposited on exterior wall 51 over all of or selected portions of the flexible substrate 45 and printed sensors and conductors. The protective layer can be composed of, for example, an insulating or di-electric ink composition, an epoxy or other insulating resin, a thermoplastic resin, a thermoplastic elastomer, or silicone that may be applied over the flexible substrate 45, printed sensors and conductor pairs. Alternately, the protective layer can be deposited over the entire circumference of the conduit 50 where the flexible substrate 45 and printed sensors are located encasing the exterior wall section 51 of the conduit 50, such as the protective layer 400 shown in FIG. 2 and FIG. 5. This method would be used, for example, to protect the flexible substrate and printed sensors mounted along the entire length of an exterior wall 51 of a conduit 50, such as to protect for example, a strip of temperature sensors 10 or strain gauge sensors 20.

Protective layers 300 and 400 cover and effectively pot the substrate 45 and their associated printed sensors and wire networks protecting them from damage by external influences caused by road debris, weather, road hazards or other mechanical effects of the operation of a vehicle.

Alternately, the protective layer could cover only specific areas of the sensor that are located along the conduit 50. As is shown in FIG. 3, this method would be used to protect, for example, a flexible substrate having a strip of leak detection sensors 30. A protective layer, for example, 325 and 325' would effectively pot only specific portions of the printed sensors and their wire networks, allowing the conductive traces 35 of a leak detector 30 exposed to enable the detection of fluid leaks.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "vessel," or "system," within a claim is understood and intended to refer to structures known to those skilled in the relevant art, as further modified or enhanced by the features of the claims themselves and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A fluid conduit having an interior diameter and an exterior wall, the fluid conduit comprising:
   a flexible substrate having electronic material printed on the substrate, the electronic material configured to sense at least one operating parameter of the fluid conduit and to provide output signals representing the sensed operating parameter;
   an adhesive layer for attaching the substrate to the exterior wall of the fluid conduit; and
   an electrical conductor for communicating the output signals deposited on the exterior wall of the fluid conduit.

2. The fluid conduit according to claim 1, wherein the at least one operating parameter of the conduit is selected from a group consisting of the temperature of the conduit wall, the positive or negative pressure acting on the conduit wall, or the integrity of the conduit wall.

3. The fluid conduit according to claim 1, wherein the printed electronic material produces at least one sensor element configured to sense and provide the output signals representing a sensed operating parameter of the fluid conduit.

4. The fluid conduit according to claim 3, wherein the at least one sensor element is selected from a group consisting of electrical conductors and resistive elements, the electrical conductors and resistive elements combined to form at least one of:
   a temperature sensor for measuring the temperature of the wall;
   a strain gauge sensor for measuring the positive or negative pressure acting on the conduit wall;
   a leak detection sensor, for measuring the integrity of the conduit wall.

5. The fluid conduit according to claim 1, wherein the electronic material is printed on the substrate by at least one of:
   a lithographic printing process;
   a screen printing process; or
   a digital printing process.

6. The fluid conduit according to claim 1, wherein a protective layer is deposited over the substrate and selected portions of the electronic material the protective layer is composed of at least one of an insulating ink, a di-electric ink, a thermoset or cross-linked resin such as epoxy, an insulating resin, a thermoset or cross-linked elastomer, a thermoplastic elastomer or a silicone.

7. The fluid conduit according to claim 6, wherein the protective layer is applied over the entire circumference of the conduit where the substrate is attached.

8. The fluid conduit according to claim 1, wherein the conductor for communicating is adapted to be read using a device that provides a reading of the sensed operating parameter.

9. The fluid conduit according to claim 1, wherein the adhesive layer is applied to the substrate and the substrate is attached to the exterior wall of the fluid conduit, wherein the substrate conforms to the shape of the exterior wall.

10. A method for sensing at least one operating parameter of a fluid conduit, the fluid conduit including an exterior wall, the method comprising:
    printing electronic material on a flexible substrate, the electronic material used to sense the at least one operating parameter and to provide output signals representing the sensed operating parameter;
    applying an adhesive layer to attach the substrate to the exterior wall of the fluid conduit; and
    depositing an electrical conductor for communicating the output signals on the exterior wall of the fluid conduit.

11. The method of claim 10, wherein the at least one operating parameter is selected from a group consisting of the temperature of the conduit wall, the positive or negative pressure acting on the conduit wall and the integrity of the conduit wall.

12. The method of claim 10, wherein the method further comprises:
    producing at least one sensor element from the printed electronic material,
    the sensor element configured to sense and provide the output signals representing the at least one sensed operating parameter of the fluid conduit.

13. The method of claim 12, wherein the method further comprises:
    selecting the at least one sensor element from a group consisting of electrical conductors and resistive elements, the electrical conductors and resistive elements combined to form at least one of:
- a temperature sensor for measuring the temperature of the conduit wall;
- a strain gauge sensor for measuring the positive or negative pressure acting on the conduit wall;
- a leak detection sensor for measuring the integrity of the conduit wall.

14. The method of claim 10, wherein the electronic material is printed on the substrate by at least one of:
- a flexographic printing process;
- a screen printing process; or
- a digital printing process.

15. The method of claim 10, wherein method further includes:
- depositing a protective layer over the substrate and selected portions of the electronic material the protective layer composed of at least one of an insulating ink, a di-electric ink, a thermoset or cross-linked resin such as epoxy, an insulating resin, a thermoset or cross-linked elastomer.

16. The method of claim 15, wherein the protective layer is deposited over the entire circumference of the conduit where the substrate is attached.

17. The method of claim 12, wherein the method further includes:
- connecting a device to the electrical conductor for communicating and the output signals representing the operating parameter from the at least one sensor element, the device adapted to read the operating parameter.

18. The method of claim 12, wherein the method further comprises:
- recording and storing the output signals communicated by the electrical conductor for communicating from the at least one sensor element, the recording device and memory communicatively connected to a processing device; and
- processing the recorded and stored output signals by the processing device for presentation to a user on a display.

19. The method of claim 10, wherein the method further includes:
- depositing the adhesive layer on the substrate and attaching the substrate to the exterior wall of the fluid conduit, wherein the substrate conforms to the shape of the exterior wall when it is attached to the exterior wall of the fluid conduit.

20. A fluid conduit having an interior diameter and an exterior wall, the fluid conduit comprising:
- a flexible substrate having electronic material printed on the substrate, the electronic material configured to sense at least one operating parameter of the fluid conduit and to provide output signals representing the sensed operating parameter;
- an adhesive layer for attaching the substrate to the exterior wall of the fluid conduit; and
- an electrical conductor for communicating the output signals deposited on the exterior wall of the fluid conduit extending in an axial direction of the fluid conduit.

* * * * *